United States Patent
Li et al.

(10) Patent No.: US 11,681,235 B2
(45) Date of Patent: Jun. 20, 2023

(54) SYSTEM AND METHOD FOR CLEANING AN EUV MASK

(71) Applicant: Taiwan Semiconductor Manufacturing Co., Ltd., Hsinchu (TW)

(72) Inventors: Yen-Hui Li, Hsinchu (TW); Cheng-Han Yeh, Hsinchu (TW); Tzung-Chi Fu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/477,969

(22) Filed: Sep. 17, 2021

(65) Prior Publication Data
US 2022/0283521 A1    Sep. 8, 2022

Related U.S. Application Data

(60) Provisional application No. 63/157,376, filed on Mar. 5, 2021.

(51) Int. Cl.
| | | |
|---|---|---|
| G03F 7/20 | (2006.01) | |
| G03F 7/00 | (2006.01) | |
| H05G 2/00 | (2006.01) | |
| G03F 1/82 | (2012.01) | |

(52) U.S. Cl.
CPC ............ *G03F 7/70925* (2013.01); *G03F 1/82* (2013.01); *G03F 7/70033* (2013.01); *G03F 7/70916* (2013.01); *H05G 2/003* (2013.01)

(58) Field of Classification Search
CPC .... G03F 7/70; G03F 7/70033; G03F 7/70916; G03F 7/70925; G03F 7/70908–70941; G03F 7/70975; G03F 7/70983; G03F 7/70991; G03F 7/708; G03F 7/70808; G03F 7/70841; G03F 7/7085; G03F 7/70858; G03F 7/70866; G03F 7/70883; G03F 7/7095; G03F 7/70691; G03F 7/707; G03F 7/70708; G03F 7/70716; G03F 7/70733; G03F 7/70741; G03F 1/22; G03F 1/24; G03F 1/68; G03F 1/72; G03F 1/82;
(Continued)

(56) References Cited

U.S. PATENT DOCUMENTS

| | | | |
|---|---|---|---|
| 2009/0128795 A1* | 5/2009 | Hayashi | G03B 27/62 355/75 |
| 2011/0037960 A1* | 2/2011 | Scaccabarozzi | G03F 7/70925 355/30 |
| 2012/0024318 A1 | 2/2012 | Itoh et al. | |

(Continued)

FOREIGN PATENT DOCUMENTS

| | | | |
|---|---|---|---|
| KR | 20090122647 A | * | 12/2009 |
| TW | 201640230 A | | 11/2016 |

(Continued)

*Primary Examiner* — Christina A Riddle
(74) *Attorney, Agent, or Firm* — Seed IP Law Group

(57) ABSTRACT

An extreme ultraviolet (EUV) photolithography system cleans debris from an EUV reticle. The system includes a cleaning electrode configured to be positioned adjacent the EUV reticle. The system includes a voltage source that helps draw debris from the EUV reticle toward the cleaning electrode by applying a voltage of alternating polarity to the cleaning electrode.

20 Claims, 14 Drawing Sheets

(58) Field of Classification Search
CPC ....... G03F 1/84; H05G 2/00–008; B08B 6/00; B08B 7/0028
USPC ...... 355/18, 30, 52–55, 67–77, 133; 378/34, 378/35; 250/489, 492.1, 492.2, 492.22, 250/492.23, 493.1, 504 R, 505.1, 515.1; 134/1
See application file for complete search history.

(56) References Cited

U.S. PATENT DOCUMENTS

| | | | |
|---|---|---|---|
| 2014/0253887 A1* | 9/2014 | Wu | G03F 1/82 355/30 |
| 2014/0268074 A1* | 9/2014 | Chien | G03F 7/70741 355/30 |
| 2015/0241797 A1* | 8/2015 | Onvlee | G03F 7/70925 134/6 |
| 2020/0348599 A1* | 11/2020 | Bai | G03F 7/70983 |
| 2020/0348606 A1* | 11/2020 | Perez-Falcon | G03F 7/707 |
| 2021/0041795 A1* | 2/2021 | Bruls | G03F 7/70916 |

FOREIGN PATENT DOCUMENTS

| | | | | |
|---|---|---|---|---|
| TW | 201903520 A | 1/2019 | | |
| TW | 201937272 A | 9/2019 | | |
| TW | 202006882 A | 2/2020 | | |
| WO | WO-2013083332 A1 * | 6/2013 | | G03F 7/70925 |

\* cited by examiner

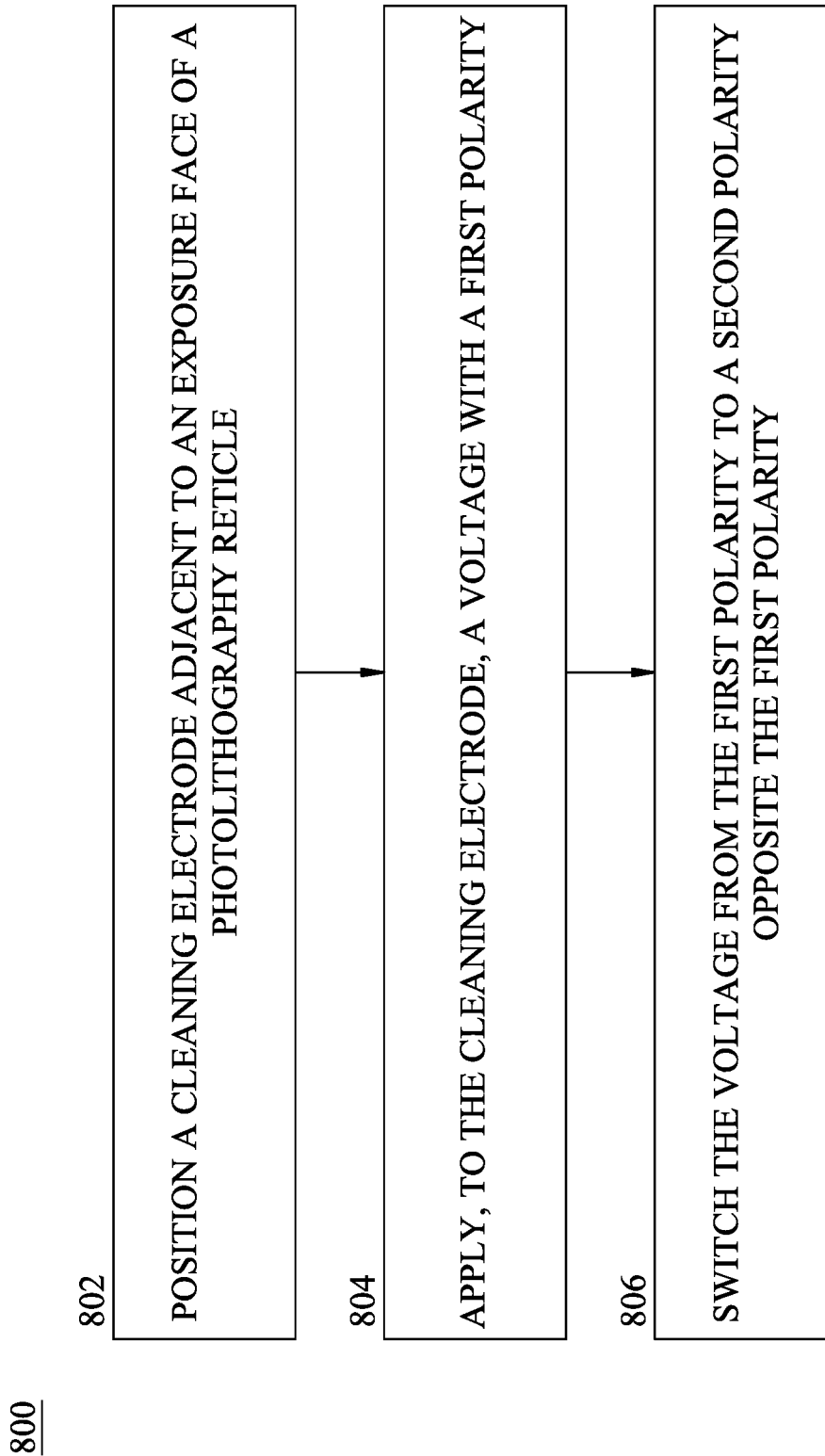

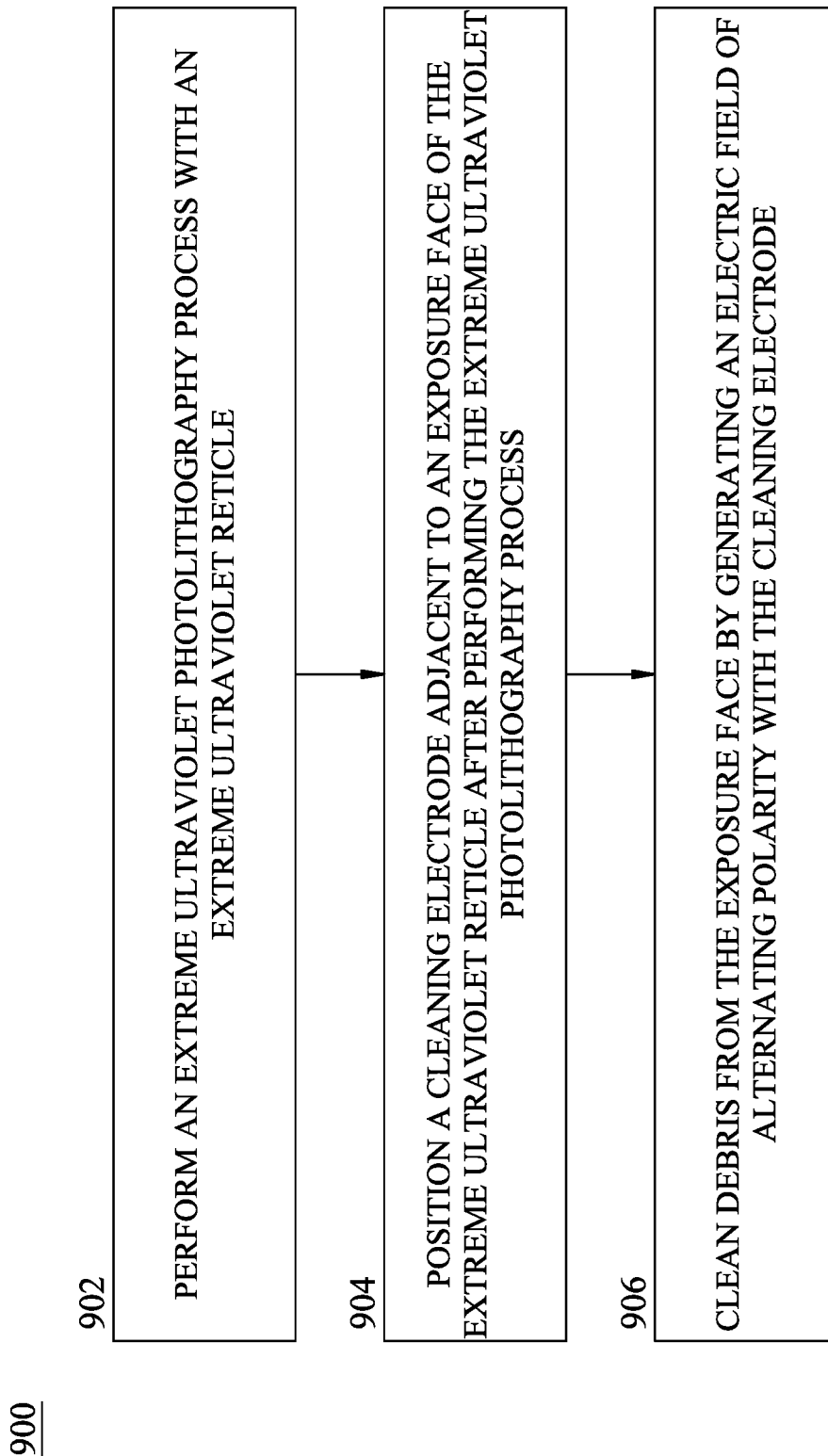

SYSTEM AND METHOD FOR CLEANING AN EUV MASK

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet (EUV) light is used to produce particularly small features due to the relatively short wavelength of EUV light. For example, EUV light is typically produced by irradiating droplets of selected materials with a laser beam. The energy from the laser beam causes the droplets to enter a plasma state. In the plasma state, the droplets emit EUV light. The EUV light travels toward a collector with an elliptical or parabolic surface. The collector reflects the EUV light to a scanner. The scanner illuminates the target with the EUV light via a reticle. However, due to the miniscule size of features to be transferred from the reticle to the integrated circuits, if even very small particles or debris fall onto the face of the reticle, then the photolithography processes may be corrupted and the resulting integrated circuits will not be functional.

BRIEF SUMMARY OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flow diagram of a method for cleaning an EUV reticle, in accordance with some embodiments.

FIG. 9 is a flow diagram of a method for cleaning an EUV reticle, in accordance with some embodiments.

DETAILED DESCRIPTION

Figure 1:
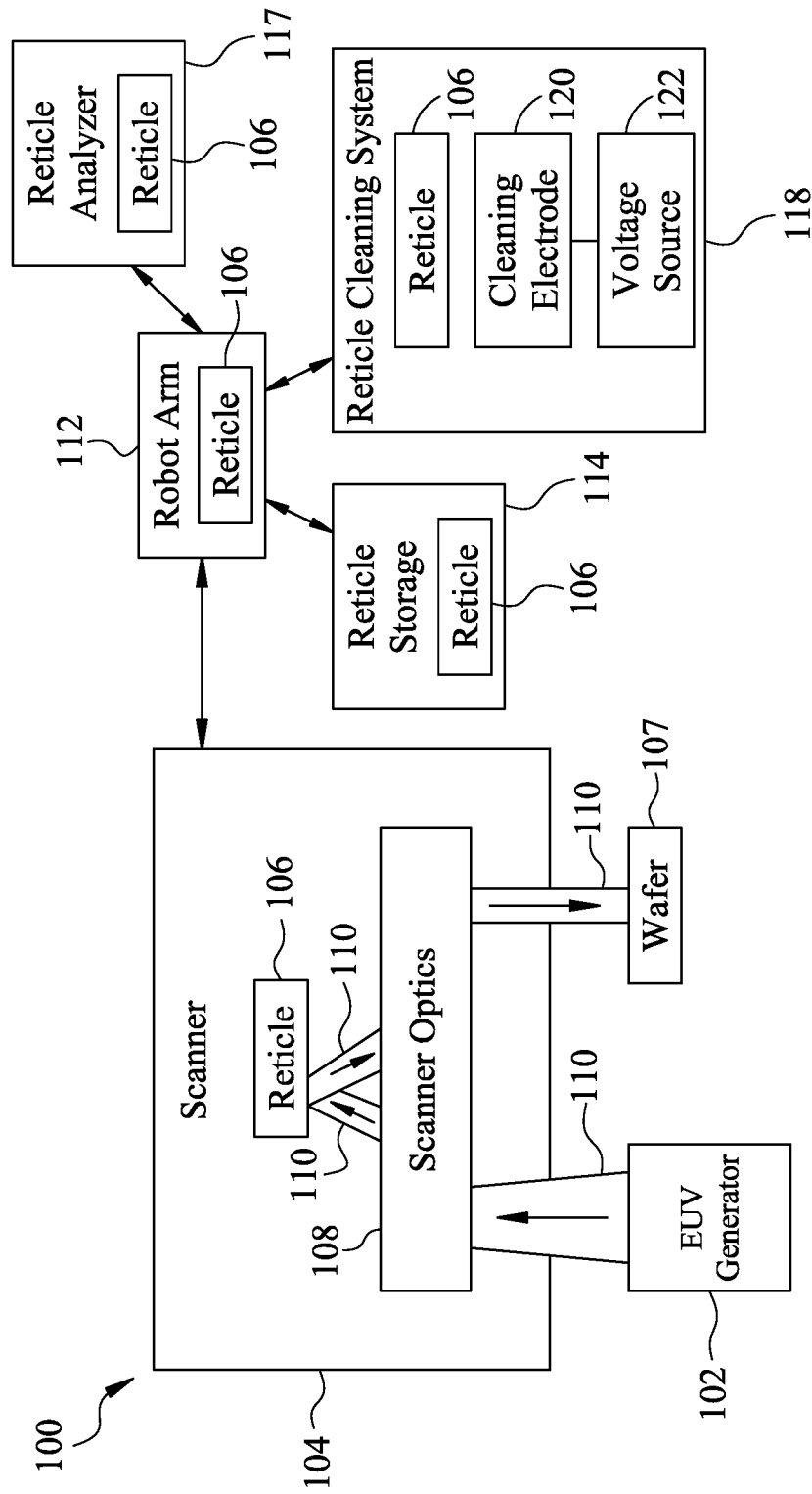
FIG. 1 is a block diagram of an EUV photolithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits to EUV photolithography systems. Embodiments of the present disclosure effectively and efficiently remove particles and other contaminants from an EUV reticle. After the EUV photolithography process, the reticle is transferred to a reticle cleaning system. The reticle cleaning system includes a cleaning electrode. The exposure face of the reticle is positioned facing the cleaning electrode a short distance from the cleaning electrode. A voltage is applied to the cleaning electrode with a first polarity. Debris particles with a net charge of a second polarity opposite the first polarity will be drawn from the reticle toward the cleaning electrode and captured by a film positioned between the cleaning electrode and the reticle. The polarity of the voltage applied to the cleaning electrode is then reversed to the second polarity. Debris particles with a net charge of the first polarity will then be drawn toward the cleaning electrode and captured by the film. This process can be repeated a number of times to fully remove all debris particles. The result is that EUV photolithography processes will not be disrupted or corrupted by the presence of debris on the exposure face of the reticle. Furthermore, expensive and time consuming reticle cleaning processes can be avoided in favor the efficient and effective process described herein. Wafer yields will improve and expensive reticles will not need to be replaced.

FIG. 1 is a block diagram of an EUV photolithography system 100, according to some embodiments. The EUV photolithography system includes an EUV generator 102, an EUV scanner 104, and an EUV reticle 106 positioned in the scanner 104. The EUV generator 102, the EUV scanner 104, and the reticle 106 perform photolithography processes on a wafer 107. The photolithography system 100 also includes a reticle cleaning system 118. As will be set forth in more detail below, the reticle cleaning system 118 helps remove debris particles from the reticle 106 in an effective and efficient cleaning process.

FIG. 1 illustrates the reticle 106 at various locations in the EUV photolithography system 100. This is to illustrate the various different locations the reticle may be 106 at various stages in its use.

The EUV generator 102 generates EUV light 110. As used herein, the terms "EUV light" and "EUV radiation" can be utilized interchangeably. In some embodiments, the EUV light 110 has a wavelength between 10 nm and 15 nm. In one example, the EUV light 110 has a central wavelength of 13.5 nm. In photolithography processes, one of the factors that affects the size of features that can be formed in a wafer is the wavelength of the light utilized in the photolithography processes. Because EUV light has a very small wavelength, EUV light can be utilized to define very small features on the wafer 107. Different EUV generation processes can provide different wavelength ranges of EUV light and different center wavelengths. Accordingly, the EUV light 110 can have different ranges of wavelengths and different center wavelengths than those described above without departing from the scope of the present disclosure.

In some embodiments, the EUV generator 102 is a laser produced plasma (LPP) EUV generation system. The photolithography system 100 includes a laser, a droplet generator, and a droplet receiver. The laser, the collector mirror, and the droplet generator cooperate to generate EUV radiation within the EUV generator 102.

The droplet generator generates and outputs a stream of droplets. The droplets can include tin, though droplets of other material can be utilized without departing from the scope of the present disclosure. The droplets move at a high rate of speed toward the droplet receiver. In some embodiments, the droplet generator generates between 40,000 and 100,000 droplets per second. The droplets have an initial velocity of between 60 m/s to 200 m/s. The droplets have a diameter between 10 µm and 200 µm. The droplet generator can generate different numbers of droplets per second than described above without departing from the scope of the present disclosure. The droplet generator can also generate droplets having different initial velocities and diameters than those described above without departing from the scope of the present disclosure.

The laser is positioned behind the collector mirror. During operation, the laser outputs pulses of laser light. The pulses of laser light are focused on a point through which the droplets pass on their way from the droplet generator to the droplet receiver. Each pulse of laser light is received by a droplet. When the droplet receives the pulse of laser light, the energy from the laser pulse generates a high-energy plasma from the droplet. The high-energy plasma outputs EUV light 110.

In some embodiments, the laser is a carbon dioxide ($CO_2$) laser. The $CO_2$ laser emits radiation or laser light with a wavelength centered around 9.4 µm or 10.6 µm. The laser can include lasers other than carbon dioxide lasers and can output radiation with other wavelengths than those described above without departing from the scope of the present disclosure.

In some embodiments, the laser irradiates each droplet with two pulses. A first pulse causes the droplet to flatten into a disk like shape. The second pulse causes the droplet to form a high temperature plasma. The second pulse is significantly more powerful than the first pulse. The laser and the droplet generator are calibrated so that the laser emits pairs of pulses such that each droplet is irradiated with a pair of pulses. For example, if the droplet generator outputs 50,000 droplets per second, the laser will output 50,000 pairs of pulses per second. The laser can irradiate droplets in a manner other than described above without departing from the scope of the present disclosure. For example, the laser may irradiate each droplet with a single pulse or with more pulses than two. Moreover, the primary laser here can not only cause droplets to flatten into disk-like shape can be mist or vapor state.

In some embodiments, the droplets are tin. When the tin droplets are converted to a plasma, the tin droplets output EUV light 110 with a wavelength centered between 10 nm and 15 nm. More particularly, in some embodiments, the tin plasma emits EUV radiation with a central wavelength of 13.5 nm. These wavelengths correspond to EUV radiation. Materials other than tin can be used for the droplets without departing from the scope of the present disclosure. Such other materials may generate EUV radiation with wavelengths other than those described above without departing from the scope of the present disclosure.

In some embodiments, the light 110 output by the droplets scatters randomly in many directions. The photolithography system 100 utilizes the collector mirror to collect the scattered EUV light 110 from the plasma and output the EUV light toward the scanner 104.

The scanner 104 includes scanner optics 108. The scanner optics 108 include a series of optical conditioning devices to direct the EUV light 110 to the reticle 106. The scanner optics 108 may include refractive optics such as a lens or a lens system having multiple lenses (zone plates). The scanner optics 108 may include a reflective optics, such as a single mirror or a mirror system having multiple mirrors. The scanner optics 108 direct the ultraviolet light 110 from the EUV generator 102 to the reticle 106. Further details regarding the reticle 106 are provided further below.

The ultraviolet light 110 reflects off of the reticle 106 back toward further optical features of the scanner optics 108. In some embodiments, the scanner optics 106 include a projection optics box. The projection optics box may have refractive optics, reflective optics, or combination of refractive and reflective optics. The projection optics box may include a magnification less than 1, thereby reducing the patterned image included in the EUV light 110 reflected from the reticle 106. The projection optics box directs the EUV light onto the wafer 107.

The EUV light 110 includes a pattern from the reticle 106. In particular, the reticle 106 includes the pattern to be defined in the wafer 107. After the EUV light 110 reflects off of the reticle 106, the EUV light 110 contains the pattern of the reticle 106.

A layer of photoresist typically covers the target during extreme ultraviolet photolithography irradiation. The photoresist assists in patterning a surface of the semiconductor wafer in accordance with the pattern of the reticle 106.

The projection optics box focuses the extreme ultraviolet light onto the wafer 107. The extreme ultraviolet light irradiates the photoresist with a pattern corresponding to the pattern of the reticle 106. The exposed portions of the photoresist undergo a chemical change that enables portions of the photoresist to be removed. This pattern leaves photoresist on the surface of the semiconductor wafer in a pattern of the reticle 106. Etching processes, thin film deposition processes, and/or doping processes are performed in the presence of the patterned photoresist.

Typically, a large number of reticles are utilized during fabrication of a single semiconductor wafer. Each reticle has a particular pattern corresponding to semiconductor fabrication processes. One or more etching, deposition, or doping processes are performed in accordance with each reticle.

If there are defects in the reticle 106, then corresponding defects may occur in the various semiconductor processes associated with the reticle 106. The defects that propagate from the reticle 106 to the fabrication processes can result in semiconductor devices that do not function properly. Semiconductor devices that do not function properly represent a waste of large amounts of resources due to the large amount of time, expensive tools, and expensive materials utilized to fabricate each semiconductor device. Accordingly, it is beneficial to reduce as many defects as possible in the reticle 106. Furthermore, it can be very expensive to replace a damaged or contaminated reticle.

In order to reduce or prevent defects in semiconductor processes due to debris on the reticle 106, the EUV system 100 includes a reticle cleaning system 118. The reticle cleaning system 118 removes debris from the reticle 106. As will be set forth in more detail below, the reticle cleaning system 118 is highly effective in cleaning debris from the reticle 106. Furthermore, the reticle cleaning system 118 is very inexpensive compared to other solutions for cleaning a reticle.

Most or all of the debris that lands on the surface of the reticle 106 carries a net electric charge. The debris typically includes particles from the environment of the EUV generator 102 or the scanner 104. The nature of these environments may induce net electrical charges on the particles that inadvertently travel through these environments. The particles may include material from the droplets carrying a net positive or net negative charge. Charged debris or particles may come from sources other than the droplets.

When the reticle 106 is contaminated, it is very likely that both positively and negatively charged debris particles are present on the reticle 106. The debris particles may also have varying sizes. The debris particles may also have varying rigidities and elasticities. As will be set forth in more detail below, the reticle cleaning system 118 leverages the fact that there may be both positive and negatively charged particles to effectively and efficiently remove the debris particles from the reticle 106.

In some embodiments, the reticle cleaning system 118 includes a cleaning electrode 120. The cleaning electrode 120 may be in the shape of a plate having a somewhat larger area than the exposure face of the reticle 106. The reticle 106 may have a rectangular exposure face with an area between 50 cm$^2$ and 200 cm$^2$. The cleaning electrode 120 may have a rectangular surface with an area between 80 cm$^2$ and 300 cm$^2$. The reticle 106 and the cleaning electrode 120 may have other shapes and dimensions without departing from the scope of the present disclosure.

In some embodiments, the cleaning electrode 120 includes a conductive material such as a metal. The cleaning electrode 120 may include one or more of iron, copper, aluminum, titanium, tungsten, platinum, gold, or other conductive metals or materials. The material of the cleaning electrode 120 may be selected to result in establishing a strong electric field between the cleaning electrode 120 and the reticle 106, as will be described in more detail below.

When the reticle cleaning system 118 performed to cleaning process on the reticle 106, the reticle 106 and the cleaning electrode 120 are brought to close proximity of each other. The exposure face of the reticle 106 faces the surface of the cleaning electrode 120. The reticle 106 may be held above the cleaning electrode 120 with the exposure face of the reticle 106 facing downward above the cleaning electrode 120. The reticle 106 and the cleaning electrode 120 can be held at other relative positions during a cleaning process without departing from the scope of the present disclosure.

The reticle cleaning system 118 includes a voltage source 122. The voltage source 122 applies a voltage to the cleaning electrode 120. The voltage on the cleaning electrode 120 assists in establishing an electric field between the cleaning electrode 120 and the reticle 106. In some cases, the voltage source 122 may also be coupled to the reticle 106 in order to apply a ground voltage, or another voltage to the reticle 106.

The cleaning electrode 120 and the reticle 106 act as a capacitor. One plate of the capacitor is the cleaning electrode 120, while the other plate is the exposure face of the reticle 106. The capacitance C of the capacitor is given by the following relationship:

$$C = A * \varepsilon / d,$$

where A is the overlapping area of the cleaning electrode 120 and the exposure face of the reticle 106, ε is the dielectric constant of the material (or vacuum) between the cleaning electrode 120 and the exposure face of the reticle 106, and d is the distance separating the cleaning electrode 120 and the exposure face of the reticle 106. An electric field E is generated between the reticle 106 and the cleaning electrode 120 by applying a voltage between the reticle 106 and the cleaning electrode 120. The electric field E is given by the following relationship:

$$E = V/d,$$

where V is the voltage applied between the cleaning electrode 120 and the reticle 106. The total charge Q on the surface of the cleaning electrode 120 is given by the following relationship:

$$Q=C*V.$$

In some embodiments, the cleaning procedure takes place in a vacuum. In these cases, the dielectric constant c associated with the capacitance C is the dielectric constant of free space. In other cases, an inert gas such as argon or molecular nitrogen may be present in the reticle cleaning system 118. These and other gases may flow through the environment of the reticle cleaning system 118 to sweep away debris particles.

The distance d between the cleaning electrode 120 and the reticle 106 may be between 1 cm and 10 cm. Smaller distances d typically result in higher electric fields, as can be seen from the electric field equation above. Other distances d can be utilized without departing from the scope of the present disclosure.

During operation of the reticle cleaning system 118, a voltage is applied between the cleaning electrode 120 and the reticle 106. This results in an electric field between the cleaning electrode 120 and the reticle 106. As set forth previously, the debris particles on the reticle 106 are typically charged particles. Accordingly, if the polarity of the voltage applied to the cleaning electrode 120 is positive, then negatively charged debris particles on the exposure face of the reticle 106 will be attracted toward the cleaning electrode 120. The magnitude of the attractive force on a debris particle is equal to the net charge on the debris particle multiplied by the magnitude of the electric field E. Some of the negatively charged debris particles will be dislodged from the surface of the reticle 106 and will travel to the surface of the cleaning electrode 120. If the polarity of the voltage applied to the cleaning electrode 120 is negative, then positively charged debris particles on the exposure face of the reticle 106 will be attracted toward the cleaning electrode 120. Some of the positively charged to be particles will be dislodged from the surface of the reticle 106 and will travel to the surface of the cleaning electrode 120.

The reticle cleaning system 118 periodically reverses the polarity of the voltage applied to the cleaning electrode 120. In one example, during a first portion of the cleaning cycle, the polarity of the voltage applied to the cleaning electrode 120 is positive. During a second portion of the cleaning cycle, the polarity of the voltage applied to the cleaning electrode is negative. During the first half of the cleaning cycle in which the positive polarity is applied to the cleaning electrode 120, negative debris particles are dislodged from the reticle 106 and travel to the cleaning electrode 120. During the second half of the cleaning cycle in which the negative polarity is applied to the cleaning electrode 120, positive debris particles are dislodged from the reticle 106 and travel to the cleaning electrode 120. Changing the polarity of the voltage applied to the cleaning electrode 120 during a cleaning cycle results in drawing both positively charged and negatively charged debris particles away from the reticle 106 to the cleaning electrode 120 at different portions of the cleaning cycle.

In some embodiments, the reticle cleaning system 118 includes a film positioned between the cleaning electrode 120 and the reticle 106. The film may be an adhesive film. When debris particles are drawn from the reticle 106 toward the cleaning electrode 120, the debris particles are captured by the film. This helps ensure that debris particles drawn away from the reticle 106 during one portion of the cycle will not be drawn back to the reticle 106 during the next portion of the cycle. Furthermore, if there is initially debris on the cleaning electrode 120, the debris will not travel from the cleaning electrode to the reticle 106, but will instead be captured by the film.

It is possible that some charged debris particles will not be dislodged from the reticle 106 during any portion of the cleaning cycle. In these cases, multiple cleaning cycles may be performed. The polarity of the voltage applied to the cleaning electrode 120 may be switched multiple times. After a large number of polarity switches, even particles that are difficult to dislodge will eventually become dislodged from the reticle 106 and will be captured by the film.

In some cases, the film may need to be replaced after some number of polarity switches. In these cases, the cleaning electrode 120 and the film may be withdrawn from the reticle 106 and the film may be replaced. The cleaning electrode 120 and the film are then brought back into proximity with the reticle 106 and voltages are again applied between the cleaning electrode 120 and the reticle 106, including one or more polarity switches. This process can be repeated multiple times until all debris particles have been dislodged from the reticle 10 captured by the film.

The reticle cleaning system 118 provides many benefits over other cleaning processes. The reticle cleaning system 118 can accomplish a full and thorough cleaning process in only a few minutes. Furthermore, the reticle cleaning system 118 utilizes inexpensive components including the cleaning electrode 120 and the replaceable films. This is in contrast to other cleaning processes that take multiple days to complete and that utilize expensive tools and processes such as irradiation with ultraviolet light, flowing ozone, performing sonic cleaning procedures, rinsing with deionized water, and spin drying.

In order to reduce the possibility of contamination of the exposure face of the reticle 106 when the reticle 106 is not in use, the EUV system 100 includes an EUV storage 114. The EUV storage 114 may include a storage and protection pod that encloses and protects the reticle 106 when the reticle 106 is not in use. After the reticle 106 has been initially manufactured, the reticle 106 may immediately be enclosed in the EUV storage 114. The reticle 106 remains in the EUV storage 114 during transport from the manufacturing site to the wafer processing site. The reticle storage 114 may provide very strong protection against contaminants when the reticle 106 is not in use. However, the reticle storage 114 does not protect the reticle 106 when the reticle 106 is loaded into the scanner 104.

The reticle 106 remains in the EUV storage 114 until the reticle 106 is to be utilized in the EUV photolithography process. At this time, the reticle 106 is transferred from the EUV storage 114 into the scanner 106. The EUV storage 114, or portions of the EUV storage 114 may be carried into the scanner 104. The reticle 106 is then unloaded from the EUV storage onto a chuck (not shown) in the scanner 106. The chuck holds the reticle 106 during the EUV process. After the EUV process, the reticle 106 is unloaded from the chuck to the EUV storage 114.

When the reticle 106 is loaded into the scanner 104 for photolithography processes, it is possible that the reticle 106 may become contaminated. One source of contamination is debris and particles from the EUV generator 102. In particular, as the droplets are irradiated within the EUV generator 102, material may be ejected from the droplets. The material ejected from the droplets includes droplet particles. Some of droplet particles may travel into the scanner 104 and they eventually land on the exposure face of the reticle 106. Debris or particles from sources other than the droplets may also enter into the scanner 104 and eventually land on the exposure face of the reticle 106.

The EUV system 100 may include a reticle analyzer 120. The reticle analyzer 120 may analyze the reticle 106 in order to detect whether there has been any contamination of the reticle 106. The reticle analyzer 120 can detect debris or particles on the exposure face of the reticle 106 or on other locations of the reticle 106. The reticle analyzer 120 may be utilized anytime the reticle is loaded into the scanner 104 or unloaded from the scanner 104. Put another way, reticle analyzer 102 may analyze the reticle 106 for contamination anytime that the reticle is unloaded from the reticle storage 114 or is about to be loaded into the reticle storage 114.

The reticle analyzer 120 can include various types of scanning systems for scanning the exposure face, or other surfaces, of the reticle 106. The scanning systems can include one or more image capture devices that capture images of the reticle 106. The images may then be passed to an image analysis system that analyzes the images to detect the presence of debris or contamination in the images. The scanning systems can include other types of optical debris detection systems. Various other types of scanning systems can be utilized for the reticle analyzer 120 without departing from the scope of the present disclosure. The reticle 106 may be taken to the reticle cleaning system 118 in response to the reticle analyzer detecting debris on the reticle 106.

Figure 2A:
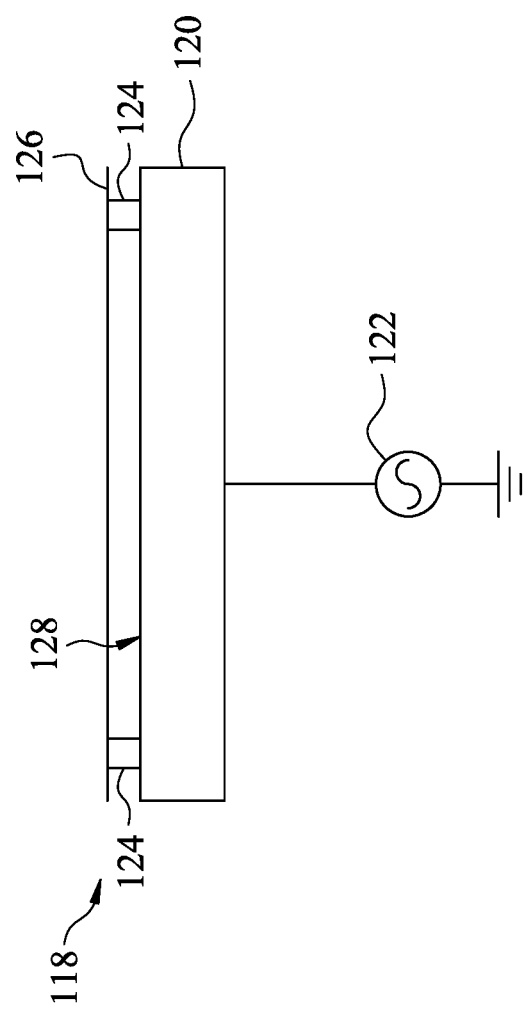
FIG. 2A is a side view of a reticle cleaning system, in accordance with some embodiments.

The EUV system 100 includes one or more robot arms 112. The one or more robot arms 112 can transfer the reticle 106 between the scanner 104, the reticle stories 114, the reticle analyzer 117, and the reticle cleaning system 118. The EUV system 100 can include other types of reticle transport systems without departing from the scope of the present disclosure FIG. 2A is a side view of a reticle cleaning system 118, in accordance with some embodiments. The reticle cleaning system 118 of FIG. 2A is one example of the reticle cleaning system 118 of FIG. 1. The reticle cleaning system 118 can be utilized to clean debris from the reticle 106 of an EUV photolithography system.

The reticle cleaning system 118 includes a cleaning electrode 120. The cleaning electrode 120 includes a flat top surface 128. Accordingly, the cleaning electrode 120 has a shape of a plate. The cleaning electrode 120 can include other shapes without departing from the scope of the present disclosure.

The cleaning electrode 120 can include a conductive material such that the cleaning electrode 120 can be utilized to generate an electric field between the cleaning electrode 120 and a reticle 106. The cleaning electrode 120 can be metal including one or more of aluminum, copper, iron, gold, titanium, platinum, or other metals. The cleaning electrode 120 can include alloys of various metals or other materials. The cleaning electrode 120 can include other materials without departing from the scope of the present disclosure.

The reticle cleaning system 118 includes one or more support pins 124. The support pins 124 are positioned on the top surface 128 of the cleaning electrode 120. The support pins 124 may protrude from the top surface 128 of the cleaning electrode 120 to a height between 2 mm and 10 mm. The top surface 128 of the cleaning electrode 120 may include grooves or slots sized to receive and hold the support pins 124. The support pins 124 may include a ceramic material, a plastic material, or a conductive material. The ceramic pins can have other materials and dimensions without departing from the scope of the present disclosure.

The reticle cleaning system 118 includes a film 126. The film 126 rests on top of the support pins 124. The support pins 124 maintain the gap between the film 126 and the top surface 128 of the cleaning electrode 120. The film 126 may be termed a debris capture film for reasons set forth in more detail below.

The film 126 may include an adhesive surface. Charged debris particles that travel from the reticle 106 toward cleaning electrode 120 land on the film 126. Because the film 126 has an adhesive surface, the charged debris particles stick to the adhesive film 126. The adhesive film 126 may be adhesive on both top and bottom surfaces so that debris particles that travel from the top surface 128 of the cleaning electrode 120 toward the reticle 106 will adhere to the adhesive bottom surface of the film 126.

The film 126 may include a flexible polymer film that can be quickly attached to the support pins 124 and a quickly removed from the support pins 124. The film 126 may include other flexible materials without departing from the scope of the present disclosure.

The film 126 may be a rigid member. The film 126 may include a thin plate of ceramic or polymer material. The rigid member can be easily placed on and removed from the support pins 124. The film 126 may include other types of rigid members and other materials without departing from the scope of the present disclosure.

The voltage source 122 may be coupled to the cleaning electrode 120 by an electrical connector. The electrical connector can include a wire, a bar, or other types of electrical connectors that can facilitate application of a voltage from the voltage source 122 to the cleaning electrode 120.

Figure 2B:
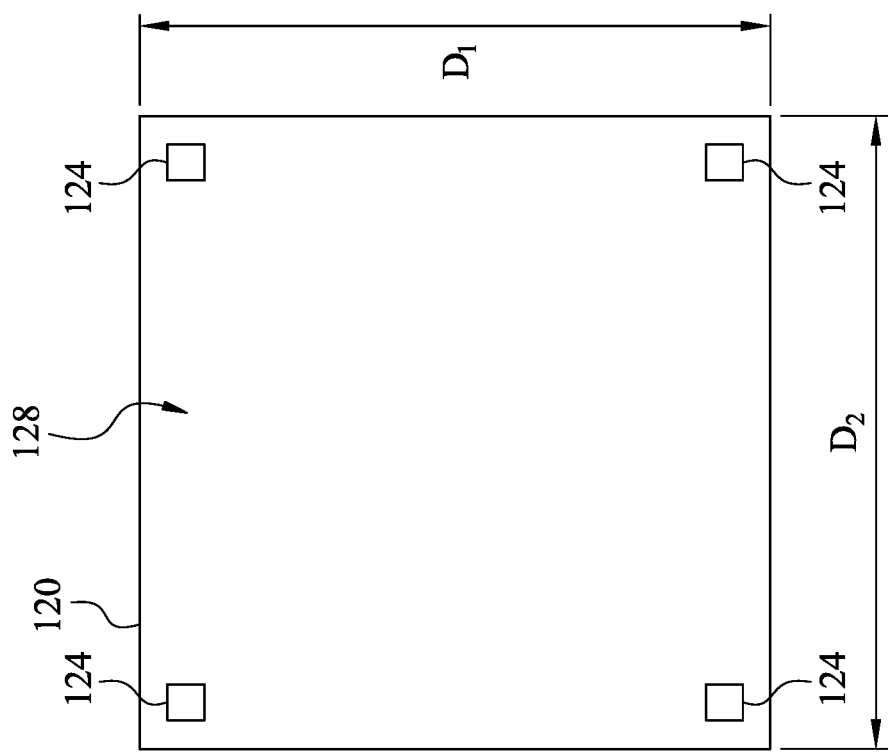
FIG. 2B is a top view of a cleaning electrode of a reticle cleaning system, in accordance with some embodiments.

FIG. 2B is a top view of the cleaning electrode 120 of FIG. 2A, in accordance with some embodiments. The cleaning electrode 120 is rectangular. The cleaning electrode 120 may be square. The cleaning electrode 120 has a first dimension D1 and a second dimension D2. D1 and D2 may be equal or may not be equal. D1 and D2 may have values between 9 cm and 17 cm. The cleaning electrode 120 can have other shapes and dimensions without departing from the scope of the present disclosure.

The top view of FIG. 2B also illustrates for support pins 124. Each support pin 124 is positioned near a corner of the top surface 128 of the cleaning electrode 120. However, there can be different numbers of support pins, different shapes, and different positions without departing from the scope of the present disclosure.

FIG. 2B does not illustrate the film 126. The film 126 overlays the top surface 128 when the film 126 is positioned on the support pins 124. The film 126 may be rectangular. The film 126 may have dimensions slightly smaller or slightly larger than D1 and D2. Alternatively, the film 126 may have the same dimensions as the cleaning electrode 120. The film 126 can have other shapes and dimensions without departing from the scope of the present disclosure.

Figure 3A:
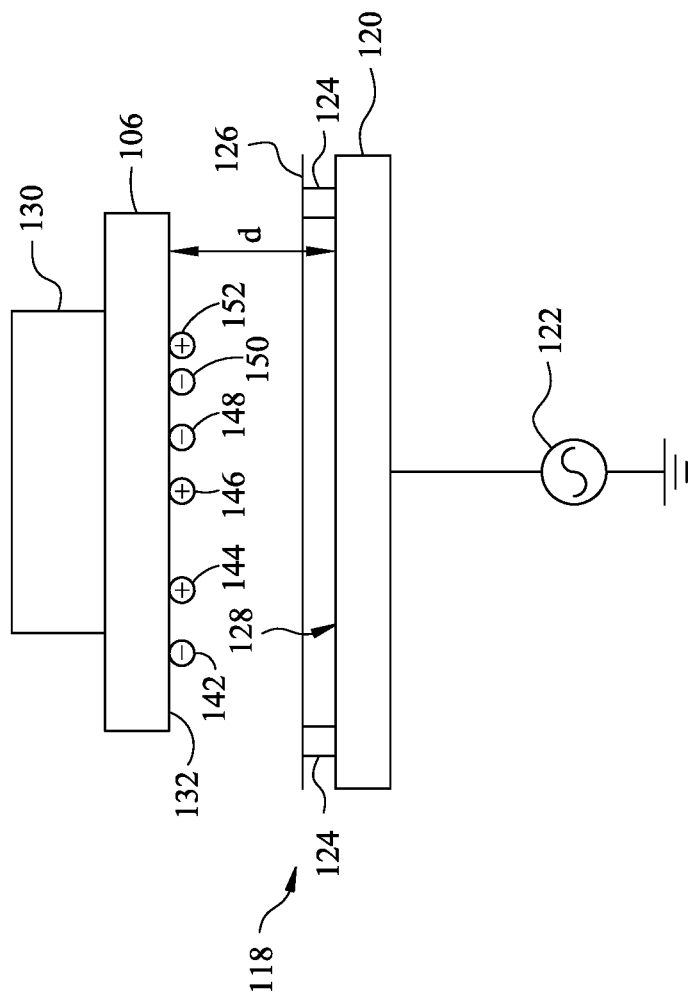
FIGS. 3A-3E are views of a reticle cleaning system and a photolithography reticle, in accordance with some embodiments.

FIG. 3A is an illustration of a chuck 130 holding a reticle 106 above a cleaning electrode 120 of the reticle cleaning system 118, in accordance with some embodiments. The reticle cleaning system 118 can be substantially similar to the reticle cleaning system 118 of FIGS. 2A and 2B. The chuck 130 holds the reticle 106 with the exposure face 132 of the reticle 106 facing downward. The exposure face 132 includes a pattern for patterning a wafer as described in relation to FIG. 1.

FIG. 3A illustrates debris particles 142, 144, 146, 148, and 150, and 152. The debris particles 142, 148, and 150 carry a net negative charge. The debris particles 144, 146, and 152 carry a net positive charges. For illustrative purposes, the debris particles of FIG. 3A are shown much larger relative to the reticle 106 than they would be in practice. In practice, debris particles may have diameters or dimensions between 10 nm and 200 μm, though debris particles may have other dimensions without departing from the scope of the present disclosure.

The exposure face 132 of the reticle 106 is separated from the top surface 128 of the cleaning electrode 120 by a distance d. The distance d may be between 1 cm and 10 cm. Other distances can be utilized without departing from the scope of the present disclosure.

The film 126 rests on the support pins 124. The film 126 is at a position between the exposure face 132 of the reticle 106 and the top surface 128 of the cleaning electrode 120. As described previously, the film 126 may be an adhesive film or may have an adhesive surface.

In the view of FIG. 3A, the voltage supply 122 is not supplying a voltage to the cleaning electrode 120. The application of voltages will be described in relation to FIGS. 3B-3D.

Figure 3B:
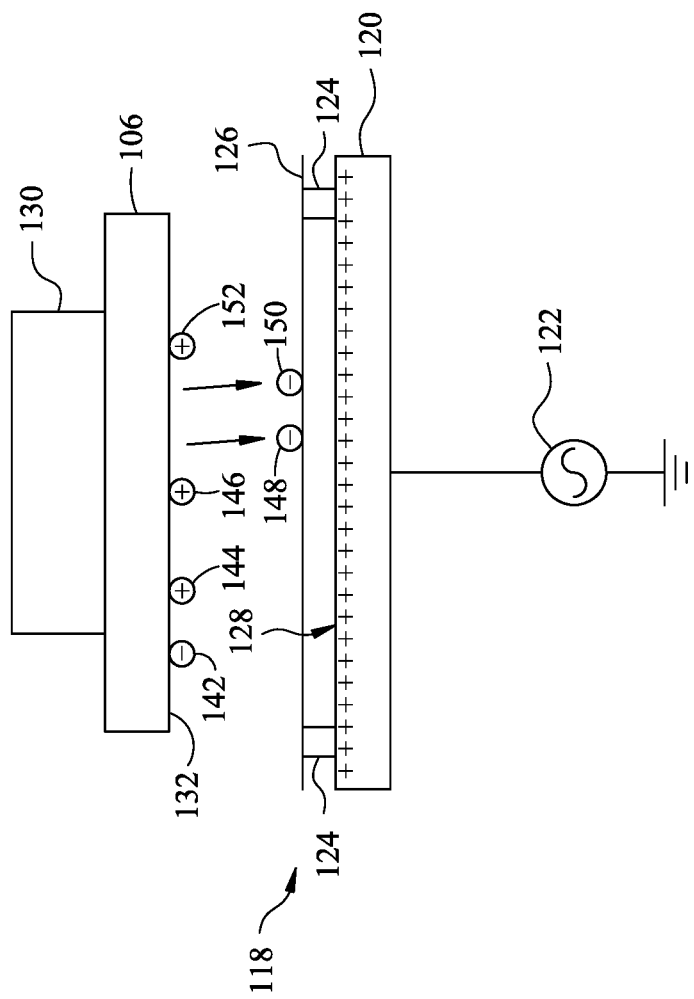

In FIG. 3B, the voltage supply 122 applies a positive polarity voltage to the cleaning electrode 120. The voltage supply 122 may also ground the reticle 106. The result is that an electric field is generated between the cleaning electrode 120 and the reticle 106. Positive charges accumulate at the top surface 128 of the cleaning electrode 120. The negatively charged debris particles 142, 148, and 150 are subjected to an electric force that attracts the negatively charged debris particles 142, 148, and 150 to the cleaning electrode 120. The force is sufficient to dislodge the negatively charged particles 148 and 150. The negatively charged particles 148 and 150 accelerate toward the cleaning electrode 120. The negatively charged particles 148 and 150 encounter the film 126. The negatively charged particles 148 and 150 are now stuck on the film 126. However, the negatively charged particle 142 adheres more tightly to the reticle 106. Accordingly, the negatively charged particle 142 does not become dislodged from the exposure face 132 of the reticle 106. The positively charged particles 144, 146, and 152 are repulsed from the cleaning electrode 120 and remain at the exposure face 132 of the reticle 106.

Figure 3C:
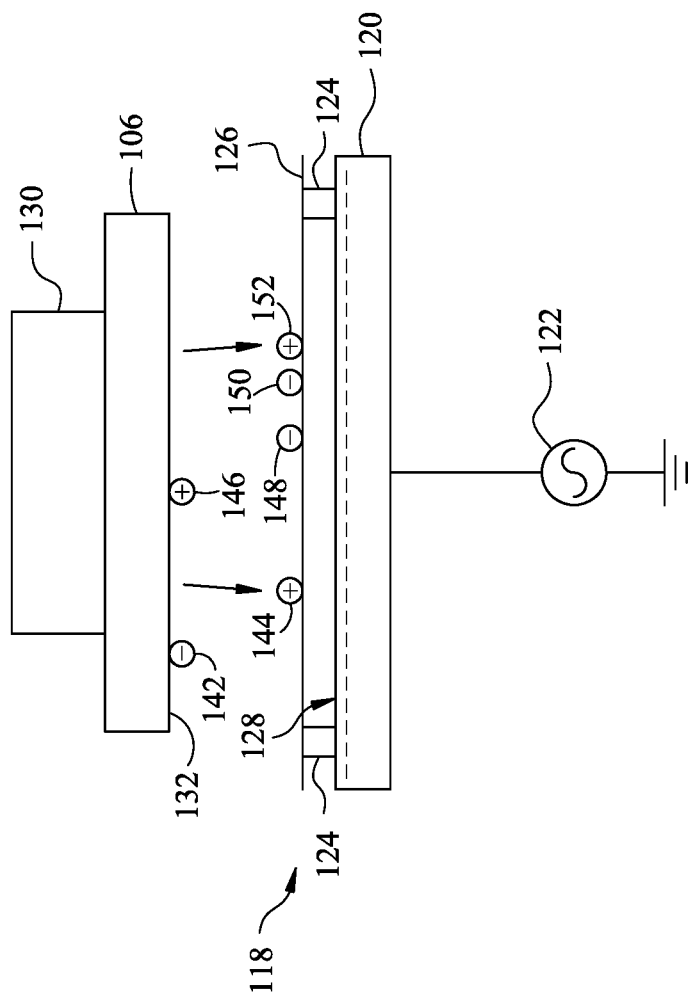

In FIG. 3C, the voltage supply 122 applies a negative polarity voltage to the cleaning electrode 120. The voltage supply 122 may also ground the reticle 106. The result is that an electric field is generated between the cleaning electrode 120 and the reticle 106. Negative charges accumulate at the top surface 128 of the cleaning electrode 120. The positively charged debris particles 144, 146, and 152 are subjected to an electric force that attracts the positively charged debris particles 144, 146, and 152 to the cleaning electrode 120. The force is sufficient to dislodge the positively charged debris particles 144 and 152. The positively charged debris particles 144 and 152 accelerate toward the cleaning electrode 120. The positively charged debris particles 144 and 152 encounter the film 126. The positively charged debris particles 144 and 152 are now stuck on the film 126. However, the positively charged particle 146 adheres more tightly to the reticle 106. Accordingly, the positively charged particle 146 does not become dislodged from the exposure face 132 of the reticle 106.

Figure 3D:
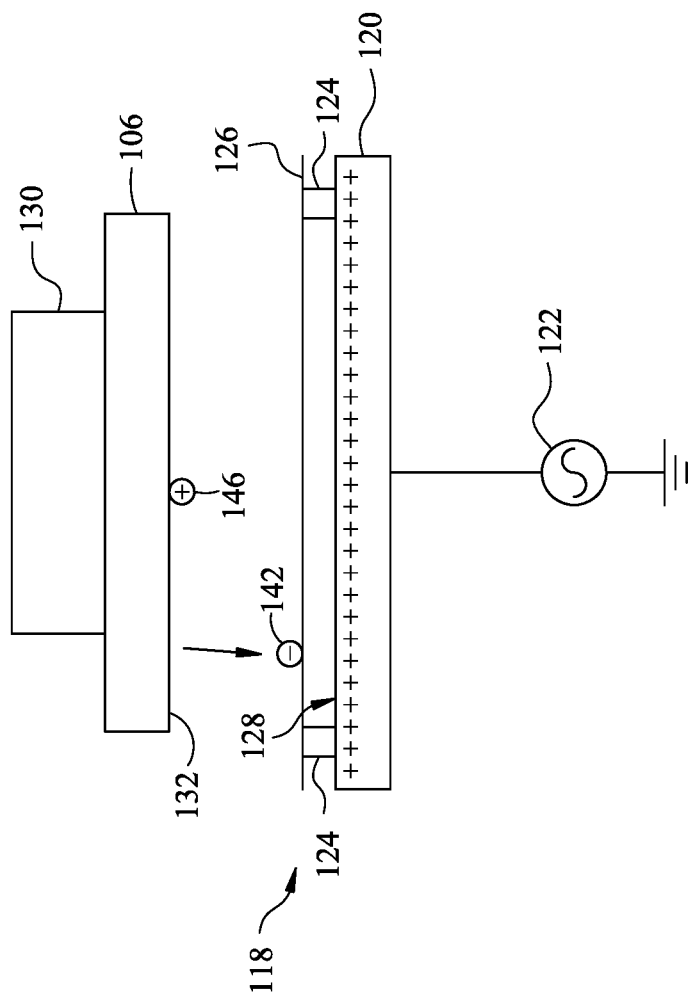

In FIG. 3D, the film 126 has been replaced. This can be accomplished by removing the cleaning electrode 120 from the proximity of the reticle 106 quickly peeling off the film 126 and replacing the film 126 with a new film 126. As can be seen in FIG. 3D, the debris particles 144, 148, 150, and 152 are not present because they were carried off with the previous film 126.

In FIG. 3D, the voltage source 122 applies a positive polarity voltage to the cleaning electrode 120. The negatively charged debris particle 142 is drawn from the exposure face 132 of the reticle 106 toward the cleaning electrode 120. The negatively charged debris particle 142 adheres to the film 126.

Figure 3E:
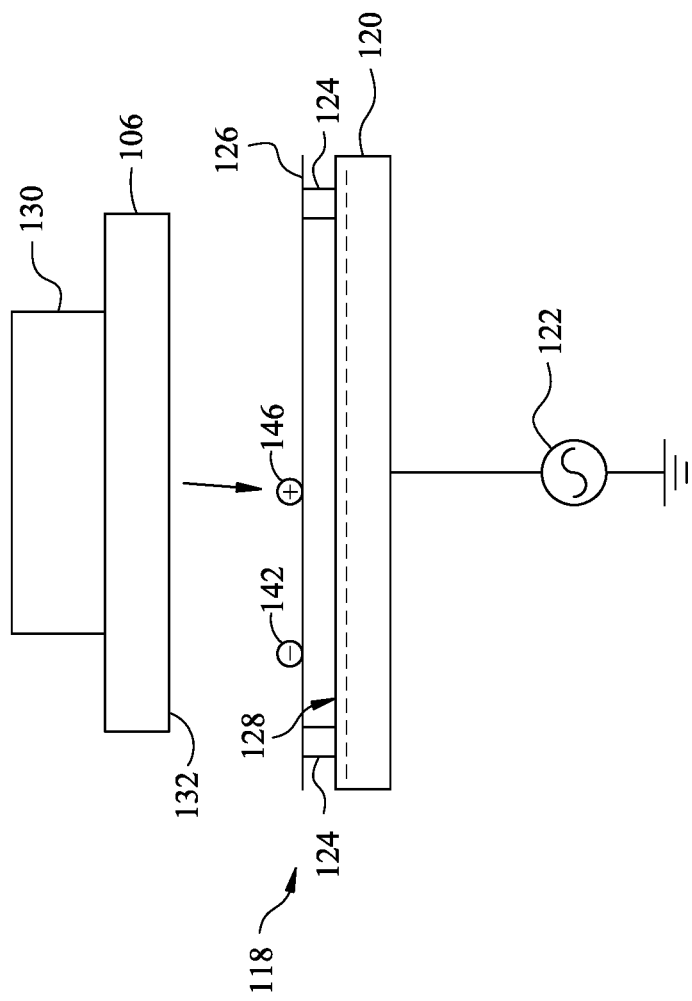

In FIG. 3E, the voltage source 122 applies a negative polarity voltage to the cleaning electrode 120 the positively charged debris particle 146 is drawn from the exposure face 132 of the reticle 106 toward the cleaning electrode 120 the positively charged debris particle 146 adheres to the film 126. At this stage, all the debris particles have been removed from the exposure face 132 of the reticle 106. In practice, the cleaning process shown in relation to FIGS. 3A-3E may include many more cycles of switching a polarity of the voltage applied to the cleaning electrode 120. In practice, the cleaning process may include many more instances of replacing the film 126 with a clean film.

Figure 4A:
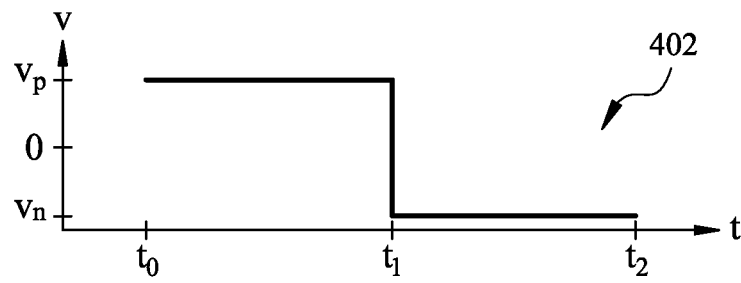
FIGS. 4A-4D are graphs associated with applying voltages to a cleaning electrode of a reticle cleaning system, in accordance with some embodiments.
Figure 4B:
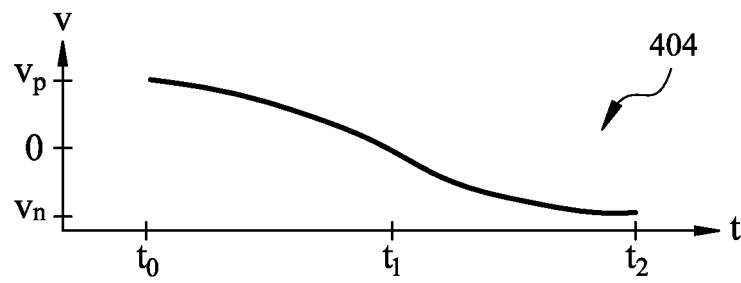
Figure 4C:
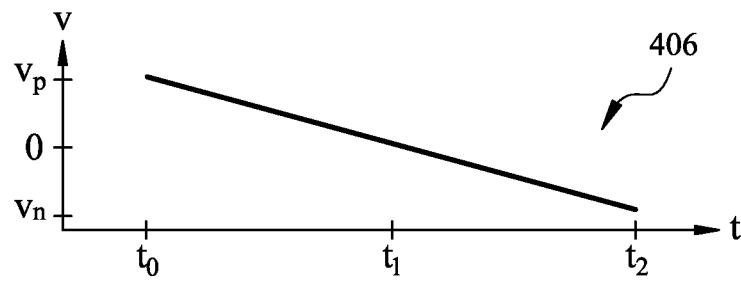

FIGS. 4A-4C illustrate a plurality of voltage waveforms 402, 404, and 406, in accordance with some embodiments. The voltage waveforms can be applied by the voltage source 122 to the cleaning electrode 120. At time t0, each of the voltage waveforms 402, 404, and 406 apply a positive voltage amplitude Vp. At time t1, each of the voltage waveforms 402, 404, and 406 crosses 0 V and switch polarity from positive to negative. This corresponds to switching a polarity of the voltage applied to the cleaning electrode 120. At time t2, one cycle of the voltage waveforms 402, 404, and 406 has ended. At time t2 each of the voltage waveforms 402, 404, and 406 has reached the negative voltage amplitude Vn. Each of the voltage waveforms 402, 404, and 406 may be repeated several times during a cleaning process. Though each of the voltage waveforms 402, 404, and 406 illustrate beginning at a positive voltage polarity, each of the voltage waveforms 402, 404, and 406 may instead begin at a negative voltage polarity and then switch to a positive voltage polarity.

The voltage waveform 402 corresponds to a square wave voltage waveform. The applied voltage begins at Vp and continues at Vp until time t1 when the voltage switches polarity to Vn. The voltage remains at Vn until time t2. At time t2, the cycle may repeat and the voltage may switch polarity to Vp.

The voltage Vp may have a range between 5 V and 100 V. The voltage Vn may have a range between −5 V and −100 V. Other voltages can be utilized without departing from the scope of the present disclosure.

A single cycle be may have a duration between ten seconds and one minute. The number of cycles used in a cleaning process may be between 1 cycle and 50 cycles. Other durations and numbers of cycles can be utilized without departing from the scope of the present disclosure.

The voltage waveform 404 corresponds to a sine wave voltage waveform. The applied voltage begins at Vp and decreases toward Vn in the form of a sinusoid. The waveform 404 crosses 0 V at time t1. The waveform 404 arrives at Vn at time t2. At this point, the waveform 404 may repeat and may quickly transition to Vp. Alternatively, the waveform 404 may increase back to Vp in the manner of a sinusoid.

The voltage waveform 406 corresponds to a linear voltage waveform. The applied voltage begins at Vp and decreases toward Vn at a linear rate. The waveform 404 crosses 0 V at time t1. The waveform 404 arrives at Vn at time t2. At this point, the waveform 404 may repeat and may quickly transition to Vp. Alternatively, the waveform 406 may increase back to Vp in a linear manner.

The voltage waveforms 402, 404, and 406 illustrate voltage waveforms that could be applied by the voltage source 122. However, in practice, the voltage that appears at top surface 128 of the cleaning electrode 120 will follow a slightly different form than the voltage waveforms 402, 404, and 406. This is because the voltage on the capacitor plate cannot instantly change. Instead, the voltage on the capacitor plate changes as charge accumulates or decreases. The charge cannot accumulate or dissipate instantly. Accordingly, the actual voltage at the top surface 128 of the will not exactly correspond to the voltage output by the voltage source 122.

Figure 4D:
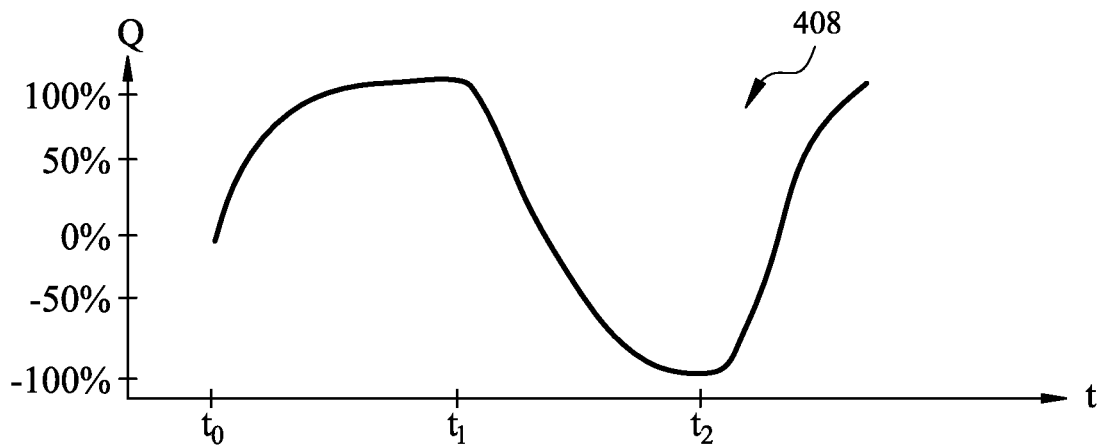

FIG. 4D illustrates a graph 408 of the charge Q at the top surface 128 of the cleaning electrode 120, in accordance with some embodiments. The graph 408 may correspond to the charge Q that accumulates when the voltage source 122 attempts to output a square wave. At time t0, there is no initial charge accumulation at the top surface 128. The voltage source outputs the positive polarity voltage Vp. The charge quickly begins to accumulate at the top surface 128. Shortly after time t0, the accumulated charge surpasses 50% of the total possible charge that can accumulate for a positive polarity voltage Vp. The accumulated charge continues to approach 100% until time t1. At time t1, the voltage source 122 switches the polarity of the voltage from positive to negative and begins outputting the negative voltage polarity Vn. The accumulated positive charge begins to decrease and crosses 0% shortly after time t1. Negative charge accumulates at the surface 128, surpasses 50% of the total possible negative charge accumulation and continues to approach 100% of total negative charge accumulation until time t2. At time t2, the voltage source 122 again switches the polarity from the negative voltage polarity Vn to the positive voltage polarity Vp. The accumulated charge begins to change from −100% toward positive 100%. Charge accumulation can be different than this without departing from the scope of the present disclosure. The voltage at the top surface 128 of the cleaning electrode 120 has the same form as the charge accumulation.

During a cycle, there may be various types of energy present in the system. These can include thermal energy associated with debris, mechanical or kinetic energy associated with debris, energy associated with elastic or plastic deformation of debris, or other types of energy that can affect the debris removal process. For example, at the beginning of a waveform cycle, the application of the voltage may cause electrothermal heating of a debris particle on the exposure surface 132 of the reticle 106. Before the polarity switch, in the example in which the debris particle and the cleaning electrode initially have the same polarity, the debris particle will have mechanical or kinetic energy as the debris particle is repelled by the cleaning electrode 120 and may move laterally along the exposure surface of 132 of the reticle 106. Depending on the material of the debris particle, the debris particle may undergo plastic or elastic deformation based on the electrostatic force. After the polarity switch, the debris particle gains mechanical energy as the debris particle is drawn toward the cleaning electrode 120 by the electrostatic force.

Figure 5:
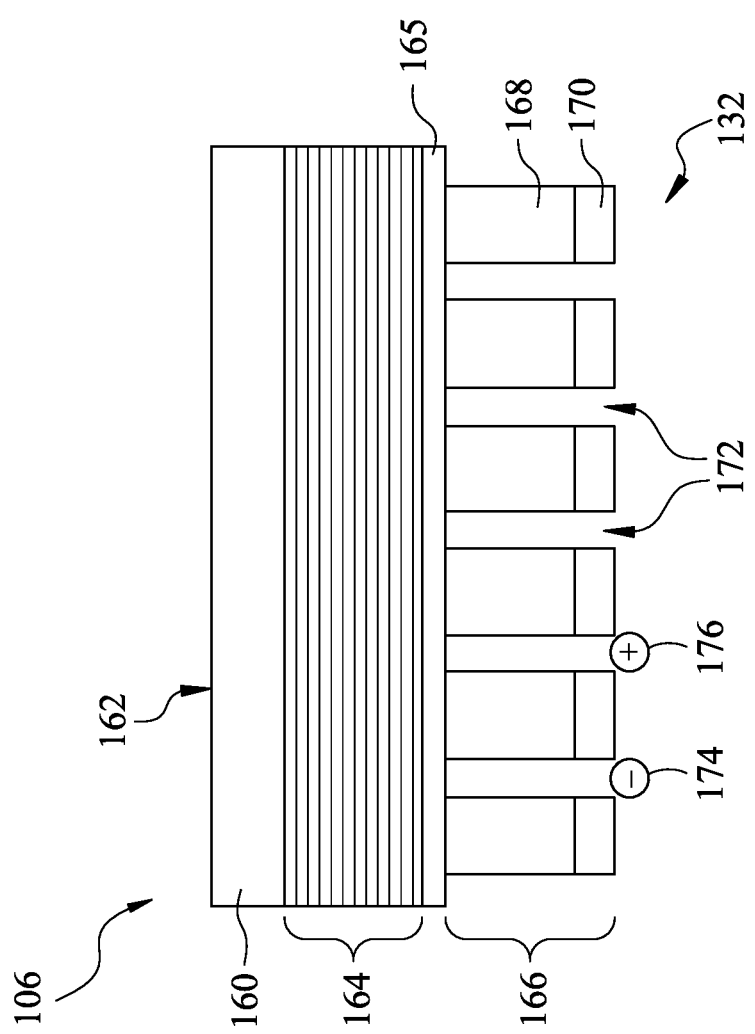
FIG. 5 is a cross-sectional view of an EUV reticle, in accordance with some embodiments.

FIG. 5 is an illustration of a reticle 106, according to some embodiments. The reticle 106 is one example of a reticle in accordance with FIG. 1 and FIGS. 3A-3E. The reticle 106 includes a substrate 160, a reflective multilayer 164 positioned on the substrate 160, a buffer layer 165 positioned on the reflective multilayer 164, and an absorption layer 166 positioned on the buffer layer 165. The substrate 160 includes a back surface 162. The back surface 162 can be considered the surface of the reticle 106 that is opposite the exposure face 132. The fabrication process of the reticle 106 eventually results in the reticle 106 having a selected pattern in the absorption layer 166. In the example of FIG. 5, the pattern is indicated by the trenches 172 in the absorption layer 166. The exposure face 132 can correspond to the exposed surface of the absorption layer 166, the exposed surface of the buffer layer 165, or the combination of the top surface of the exposed surface of the absorption layer 166 and the exposed surface of the buffer layer 165. The reticle 106 can include other structures and arrangements without departing from the scope of the present disclosure.

The substrate 160 includes a low thermal expansion material. The low thermal expansion material substrate 160 serves to minimize image distortion due to heating of the reticle 106. The low thermal expansion material substrate 160 can include materials with a low defect level and a smooth surface.

In some embodiments, the substrate 160 can include $SiO_2$. The substrate 160 can be doped with titanium dioxide. The substrate 160 can include other low thermal expansion materials than those described above without departing from the scope of the present disclosure.

Though not shown herein, in some embodiments the substrate 160 may be positioned on a conductive layer. The conductive layer can assist in electrostatically chucking the reticle 106 during fabrication and use of the reticle 106. In some embodiments, the conductive layer includes chromium nitride. The conductive layer can include other materials without departing from the scope of the present disclosure.

The reticle 106 includes the reflective multilayer 164. The reflective multilayer 164 is positioned on the substrate 160. The reflective multilayer 164 is configured to reflect the extreme ultraviolet light during photolithography processes in which the reticle 106 is used. The reflective properties of the reflective multilayer 164 are described in more detail below.

In some embodiments, the reflective multilayer 164 operates in accordance with reflective properties of the interface between two materials. In particular, reflection of light will occur when light is incident at the interface between two materials of different refractive indices. A greater portion of the light is reflected when the difference in refractive indices is larger.

The reflective multilayer 164 includes a plurality of pairs of layers. Each pair of layers includes a layer of a first material and a layer of a second material. The materials and thicknesses of the layers are selected to promote reflection and constructive interference of extreme ultraviolet light. In some embodiments, each pair of layers includes a layer of molybdenum and a layer of silicon. In one example, the layer of molybdenum is between 2 nm and 4 nm in thickness. In one example, the layer of silicon is between 3 nm and 5 nm in thickness. The thicknesses of the layers in the reflective multilayer 164 are selected based on the expected wavelength of extreme ultraviolet light used in the photolithography processes and the expected angle of incidence of the extreme ultraviolet light during the photolithography processes. The number of pairs of layers is between 20 pairs of layers and 60 pairs of layers, according to some embodiments. Other materials, thicknesses, numbers of pairs, and configurations of layers in the reflective multilayer 164 can be utilized without departing from the scope of the present disclosure. Other wavelengths of extreme ultraviolet light can be used without departing from the scope of the present disclosure.

In some embodiments, the buffer layer 165 is positioned on the reflective multilayer 164. One purpose of the buffer layer 165 is to protect the reflective multilayer during etching processes of the absorption layer 166. Accordingly, the buffer layer 165 includes materials that are resistant to etching by etching processes that etch the absorption layer 166. The etching processes and the materials of the absorption layer will be described in more detail below.

In some embodiments, the buffer layer 165 includes ruthenium. The buffer layer 165 can include compounds of ruthenium including ruthenium boride and ruthenium silicide. The buffer layer can include chromium, chromium oxide, or chromium nitride. The buffer layer 165 can be deposited by a low temperature deposition process to prevent diffusion of the buffer layer 165 into the reflective multilayer 164. In some embodiments, the buffer layer 165 has a thickness between 2 nm and 4 nm. Other materials, deposition processes, and thicknesses can be utilized for the buffer layer 165 without departing from the scope of the present disclosure.

The absorption layer 166 is positioned on the buffer layer 165. The material of the absorption layer 166 is selected to have a high absorption coefficient for wavelengths of extreme ultraviolet light that will be used in the photolithography processes with the reticle 106. In other words, the materials of the absorption layer 166 are selected to absorb extreme ultraviolet light.

In some embodiments, the absorption layer 166 is between 40 nm and 100 nm in thickness. In some embodiments, the absorption layer 166 includes material selected from a group including chromium, chromium oxide, titanium nitride, tantalum nitride, tantalum, titanium, aluminum-copper, palladium, tantalum boron nitride, tantalum boron oxide, aluminum oxide, molybdenum, or other suitable materials. Other materials and thicknesses can be used for the absorption layer 166 without departing from the scope of the present disclosure.

In some embodiments, the absorption layer 166 includes a first absorption layer 168 and a second absorption layer 170. The first absorption layer 166 is positioned on the buffer layer 165. The second absorption layer 170 is positioned on the first absorption layer 168.

In some embodiments, the first absorption layer 168 includes tantalum boron nitride. The second absorption layer 170 includes tantalum boron oxide. The thickness of the first absorption layer is between 30 nm and 80 nm. The thickness of the second absorption layer 170 is between 1 nm and 40 nm. The absorption layer 166 can include different materials, thicknesses, and numbers of layers than those described above without departing from the scope of the present disclosure. In some embodiments, the absorption layer 166 includes only a single absorption layer. Accordingly, the absorption layer 166 can be an absorption layer.

The layers of the reticle 106 shown in FIG. 5 may be formed by various thin-film deposition processes. The thin-film deposition processes can include including physical vapor deposition process such as evaporation and DC magnetron sputtering, a plating process such as electroless plating or electroplating, a chemical vapor deposition process such as atmospheric pressure chemical vapor deposition, low pressure chemical vapor deposition, plasma enhanced chemical vapor deposition, high density plasma chemical vapor deposition, ion beam deposition, spin-on coating, metal-organic decomposition, and/or other methods known in the art.

FIG. 5 also illustrates a negatively charged debris particle 174 and the positively charged debris particle 176. The charged debris particles 174 and 176 may become wholly or partially lodged in the trenches 172. The debris particles can be removed utilizing the principles described previously in relation to FIGS. 1-4D.

Figure 6:
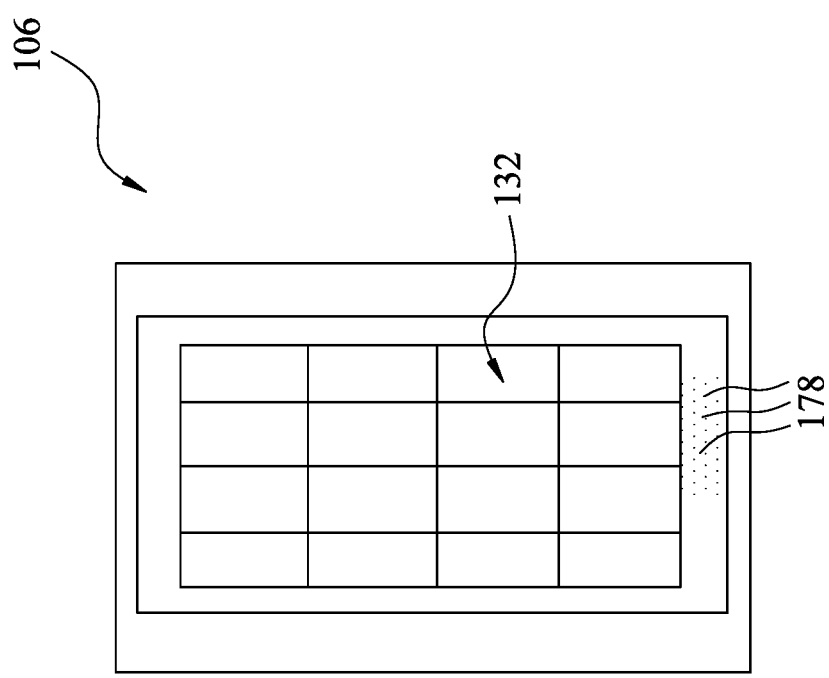
FIG. 6 is a top view of an EUV reticle, in accordance with some embodiments.

FIG. 6 is an image of a reticle 106, in accordance with some embodiments. The view of FIG. 6 is looking down onto the exposure face 132 of the reticle 106. FIG. 6 also illustrates debris 178 accumulated on the exposure face 132 of the reticle 106. A reticle 106 can have other shapes, patterns, and configurations without departing from the scope of the present disclosure.

Figure 7:
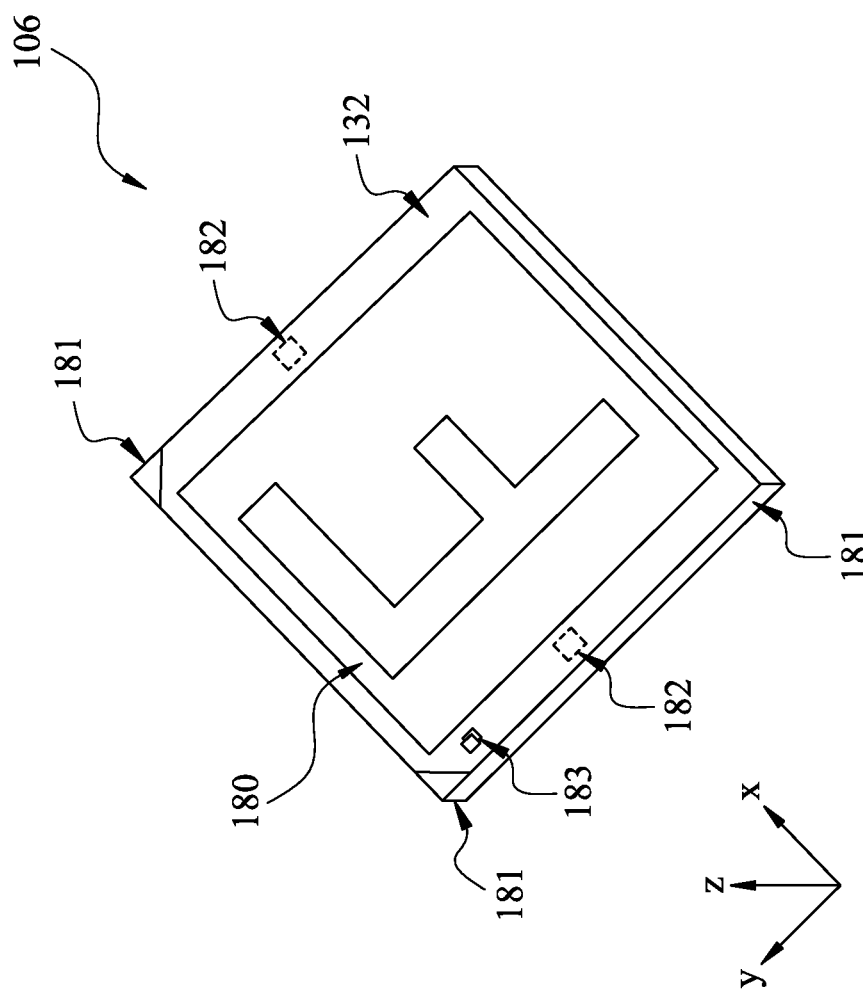
FIG. 7 is a perspective view of an EUV reticle, in accordance with some embodiments.

FIG. 7 is a perspective view of a reticle 106, in accordance with some embodiments. The exposure face 132 is facing upward in the example of FIG. 7. FIG. 7 illustrates X, Y, and Z axes. The reticle 106 includes a pattern 180. In the example of FIG. 5, the pattern 180 is then the shape of the letter F. In practice, the pattern 180 will not be in the shape of any letter. The reticle 106 includes notches 181 at three of the corners. The reticle 106 includes a barcode 183 for identification purposes. The reticle 106 includes targets 182 for aligned purposes. A reticle 106 can include other shapes, patterns, and configurations without departing from the scope of the present disclosure.

FIG. 8 is a flow diagram of a method 800 for cleaning a photolithography reticle, in accordance with some embodiments. The method 800 can utilize the systems, components, and processes described previously in relation to FIGS. 1-7. At 802, the method 800 includes positioning a cleaning electrode adjacent to an exposure face of a photolithography reticle. One example of a cleaning electrode is the cleaning electrode 120 of FIG. 1. One example of an exposure face is the exposure face 132 of FIG. 3A. One example of a photolithography reticle is the reticle 106 of FIG. 1. At 804, the method 800 includes applying, to the cleaning electrode, a voltage with a first polarity. At 806, the method 800 includes switching the voltage from the first polarity to a second polarity opposite the first polarity.

FIG. 9 is a flow diagram of a method 900 for cleaning a photolithography reticle, in accordance with some embodiments. At 902, the method 900 includes performing an extreme ultraviolet photolithography process with an extreme ultraviolet reticle. One example of a reticle is the reticle 106 of FIG. 1. At 904, the method 900 includes positioning a cleaning electrode adjacent to an exposure face of the extreme ultraviolet reticle after performing the extreme ultraviolet photolithography process. One example of a cleaning electrode is the cleaning electrode 120 of FIG. 1. One example of an exposure face is the exposure face 132 of FIG. 3A. At 906, the method 900 includes cleaning debris from the exposure face by generating an electric field of alternating polarity with the cleaning electrode.

In some embodiments, a method includes positioning a cleaning electrode adjacent to an exposure face of a photolithography reticle, applying, to the cleaning electrode, a voltage with a first polarity, and switching the voltage from the first polarity to a second polarity opposite the first polarity.

In some embodiments, a method includes performing an extreme ultraviolet photolithography process with an extreme ultraviolet reticle, positioning a cleaning electrode adjacent to an exposure face of the extreme ultraviolet reticle after performing the extreme ultraviolet photolithography process, and cleaning debris from the exposure face by generating an electric field of alternating polarity with the cleaning electrode.

In some embodiments, a reticle cleaning system includes a cleaning electrode and a debris capture film supported adjacent to the cleaning electrode and spaced apart from the cleaning electrode. The system includes a voltage source configured draw debris from a photolithography reticle to the debris capture film by applying a voltage of alternating polarity to the cleaning electrode when the cleaning electrode is adjacent to the photolithography reticle with the debris capture film positioned between the photolithography reticle and the cleaning electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
coupling a first film to support pins positioned on a cleaning electrode;
positioning the cleaning electrode adjacent to an exposure face of a photolithography reticle with the first film between the cleaning electrode and the exposure face of the photolithography reticle;
applying, to the cleaning electrode, a voltage with a first polarity; and
switching the voltage from the first polarity to a second polarity opposite the first polarity.

2. The method of claim 1, further comprising drawing charged debris particles of the second polarity from the exposure face to the first film while the voltage is at the first polarity.

3. The method of claim 2, further comprising drawing charged debris particles of the first polarity from the exposure face to the first film while the voltage is at the second polarity.

4. The method of claim 1, wherein positioning the cleaning electrode adjacent to the exposure face includes positioning the cleaning electrode directly below the exposure face.

5. The method of claim 1, wherein applying the voltage with the first polarity includes applying ground voltage to the photolithography reticle.

6. The method of claim 1, wherein the first film is a flexible film.

7. A method, comprising:
performing an extreme ultraviolet photolithography process with an extreme ultraviolet reticle;
positioning a cleaning electrode adjacent to an exposure face of the extreme ultraviolet reticle after performing the extreme ultraviolet photolithography process; and
cleaning debris from the exposure face by generating an electric field of alternating polarity with the cleaning electrode;
capturing a first portion of the debris with a first film positioned between the cleaning electrode and the exposure face while generating the electric field;
replacing the first film with a second film; and
capturing a second portion of the debris with the second film while generating the electric field with the cleaning electrode.

8. A method, comprising:
positioning a cleaning electrode adjacent to an exposure face of a photolithography reticle;
positioning a first film between the cleaning electrode and the exposure face;
applying, to the cleaning electrode, a voltage with a first polarity while the first film is positioned between the cleaning electrode and the exposure face;
switching the voltage from the first polarity to a second polarity opposite the first polarity;
removing the first film from between the cleaning electrode and the exposure face;
positioning a second film between the cleaning electrode and the exposure face;
applying, to the cleaning electrode the voltage with the first polarity after positioning the second film between the cleaning electrode and the exposure face; and
switching the voltage from the first polarity to the second polarity after positioning the second film between the cleaning electrode and the exposure face.

9. The method of claim 8, wherein positioning the first film between the cleaning electrode and the exposure face includes coupling the first film to support pins positioned on the cleaning electrode.

10. The method of claim 9, wherein the first film includes a polymer material.

11. The method of claim 7, wherein the first film is a polymer film.

12. The method of claim 7, further comprising generating the electric field by applying a voltage of alternating polarity to the cleaning electrode.

13. The method of claim 7, wherein the debris includes particles from droplets utilized to generate extreme ultraviolet light during the extreme ultraviolet photolithography process.

14. The method of claim 7, wherein positioning the cleaning electrode adjacent to the exposure face includes positioning the cleaning electrode directly below the exposure face.

15. The method of claim 7, wherein generating the electric field includes applying ground voltage to the extreme ultraviolet reticle.

16. A reticle cleaning system, comprising:
a cleaning electrode;
a debris capture film supported adjacent to the cleaning electrode and spaced apart from the cleaning electrode;
support pins extending from a surface of the cleaning electrode, wherein the support pins support the debris capture film adjacent to and spaced apart from the cleaning electrode; and
a voltage source configured draw debris from a photolithography reticle to the debris capture film by applying a voltage of alternating polarity to the cleaning electrode when the cleaning electrode is adjacent to the photolithography reticle with the debris capture film positioned between the photolithography reticle and the cleaning electrode.

17. The system of claim 16, wherein the debris capture film is a flexible film.

18. The system of claim 16, wherein the debris capture film is a rigid film.

19. The system of claim 16, wherein the debris capture electrode has a planar surface facing the debris capture film.

20. The system of claim 16, wherein the reticle is an extreme ultraviolet reticle.

\* \* \* \* \*